US006523210B1

(12) United States Patent
Andros

(10) Patent No.: US 6,523,210 B1
(45) Date of Patent: Feb. 25, 2003

(54) SURFACE CHARGE CONTROLLING APPARATUS FOR WAFER CLEANING

(76) Inventor: Nicholas Andros, 913 W. Glenrosa Ave., Phoenix, AZ (US) 85013

( * ) Notice: Subject to any disclaimer, the term of this patent is extended or adjusted under 35 U.S.C. 154(b) by 0 days.

(21) Appl. No.: 09/543,072

(22) Filed: Apr. 5, 2000

(51) Int. Cl.⁷ .............................. B08B 1/04; B08B 3/00
(52) U.S. Cl. .............................. 15/102; 15/77; 15/88.3; 15/21.1; 15/1.51; 134/6; 134/902; 134/1.3
(58) Field of Search ........................ 15/97.1, 102, 21.1, 15/77, 88.3, 179, 230.1, 230.18, 230.16, 103.5, 1.51; 401/197; 492/17, 29, 1, 31, 33, 36, 46, 49; 134/6, 7, 902, 1.3

(56) References Cited

U.S. PATENT DOCUMENTS

| | | | | |
|---|---|---|---|---|
| 5,693,148 A | * | 12/1997 | Simmons et al. | ............ 15/88.3 |
| 5,806,126 A | * | 9/1998 | de Larios et al. | ............. 15/102 |
| 6,033,486 A | * | 3/2000 | Andros | ........................ 15/1.51 |
| 6,070,284 A | * | 6/2000 | Garcia et al. | .................. 15/102 |
| 6,167,583 B1 | * | 1/2001 | Miyashita et al. | ............. 15/77 |
| 6,247,197 B1 | * | 6/2001 | Vail et al. | ........................ 15/77 |
| 6,324,715 B1 | * | 12/2001 | Hymes et al. | ................. 15/102 |
| 6,345,404 B1 | * | 2/2002 | Stephens et al. | ............... 15/102 |

* cited by examiner

Primary Examiner—Gary K. Graham
(74) Attorney, Agent, or Firm—Parsons & Goltry; Robert A. Parsons; Michael W. Goltry

(57) ABSTRACT

An apparatus for performing a wafer cleaning method includes providing a plurality of sponge portions mounted on a common body for movement relative to a surface of a wafer to be cleaned, each sponge portion defining a sponge surface positioned to contact the surface of the wafer. A cleaning fluid flow is directed through each of the sponge portions perpendicular to the sponge surface and onto the surface of the wafer to generate a streaming potential across each of the sponge portions. The fluid pressure and pH of the cleaning fluid are adjusted until electrical charges on the sponge portions, the wafer, and contaminant particles on the surface of the wafer are all the same electrical sign.

12 Claims, 10 Drawing Sheets

US 6,523,210 B1

SURFACE CHARGE CONTROLLING APPARATUS FOR WAFER CLEANING

FIELD OF THE INVENTION

This invention relates to a wafer cleaning apparatus and a method of cleaning.

More particularly, the present invention relates to wafer cleaning apparatus which is capable of controlling surface charge as it cleans and a method of cleaning.

BACKGROUND OF THE INVENTION

Polyvinyl alcohol (PVA) sponges or brushes are considered to be a new generation for cleaning a surface such as semiconductor wafers (e.g., silicon, gallium arsenide, silicon carbide, or the like) or memory disc media. Throughout this disclosure, the term "wafer" is defined to mean any of the semiconductor wafers, e.g., silicon, gallium arsenide, silicon carbide, or the like, or memory disc media, e.g., glass, aluminum, or other materials well known in the industry, and the term "wafer is used in place of these items for simplicity of the disclosure.

It is well known that the surface of a wafer, the cleaning brush, and contaminant particles surrounding the cleaning environment of an aqueous system are electrically charged Thus, the utilization of a PVA brush scrubbing process becomes a mechanical and electrical interaction between the surface to be cleaned (the wafer), the PVA brush, and the contaminant particles.

In the process of cleaning wafers, contaminating particles tend to adhere to the surfaces of these media. This adhesion or binding to the surface is due to electrical effects that the particles exhibit between the charge and the surface to be cleaned. It is extremely difficult to clean such a surface unless the contaminant particles to be cleaned and the surrounding environment can be modified to displace the contaminant particles from the surface.

The known cleaning systems used at the present time fail to provide an environment for the removal of charged particles from the surface to be cleaned. These known techniques are rather "hit-or-miss" with no attempt being made to quantitatively regulate the charge upon contaminant particles. Quantitative regulation requires that all the variables utilized in the cleaning process be carefully controlled, e.g., temperature, pH, concentration of surfactants, and most important, the electrical charge upon the surface to be cleaned. Known cleaning systems fail to accomplish the above, since they are not able to quantitatively control the variables mentioned.

It would be highly advantageous, therefore, to remedy the foregoing and other deficiencies inherent in the prior art.

Accordingly, it is an object of the present invention to provide new and improved wafer cleaning apparatus which is is capable of quantitatively controlling surface charges as it cleans and a new and improved method of cleaning wafer surfaces.

Another object of the invention is to provide new and improved apparatus and methods for cleaning wafer surfaces wherein an electrical potential is generated through the surface of a cleaning brush to control the removal of charged particles on the surface.

SUMMARY OF THE INVENTION

Briefly, to achieve the desired objects of the instant invention in accordance with a preferred embodiment thereof, provided is wafer cleaning apparatus including a plurality of sponge portions mounted on a common body for movement relative to a surface of a wafer to be cleaned, each sponge portion defining a sponge surface positioned to contact the surface of the wafer. The apparatus further includes means for directing a cleaning fluid flow through each of the sponge portions perpendicular to the sponge surface and onto the surface of the wafer to generate a streaming potential across each of the sponge portions.

To further achieve the desired objects of the instant invention in accordance with a preferred embodiment thereof, a method of cleaning wafers includes providing a plurality of sponge portions mounted on a common body for movement relative to a surface of a wafer to be cleaned, each sponge portion defining a sponge surface positioned to contact the surface of the wafer. A cleaning fluid flow is directed through each of the sponge portions perpendicular to the sponge surface and onto the surface of the wafer to generate a streaming potential across each of the sponge portions. The fluid pressure and pH of the cleaning fluid are adjusted until electrical charges on the sponge surfaces, the wafer, and contaminant particles on the surface of the wafer are all the same electrical sign.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENT

Figure 1:
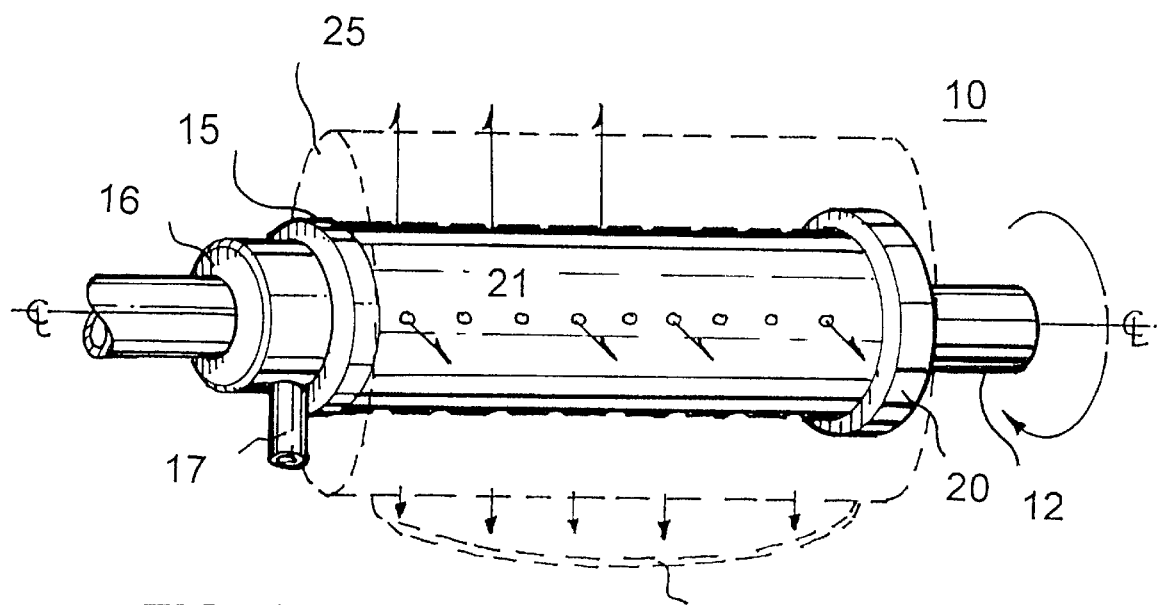
FIG. 1 is an isometric view of surface charge controlling apparatus for cleaning wafers in accordance with the present invention.

Turning now to the drawings in which like reference characters indicate corresponding elements throughout the several views, attention is first directed to FIG. 1 which illustrates surface charge controlling apparatus 10 for cleaning wafers, e.g. wafer 11, in accordance with the present invention. Apparatus 10 is mounted on a motor shaft 12 (motor not shown) for continuous rotation during the cleaning process. In this specific embodiment and for purposes of explanation only, apparatus 10 includes an inner core insert 15 mounted on shaft 12 for rotation therewith. A non-rotating sealed reagent supplying member 16 is positioned in abutting engagement with one end (the left end in FIG. 1) of core insert 15 and includes a reagent duct 17 in communication therewith to provide a continuous supply of reagent to member 16. An end plug 20 is positioned in abutting engagement with the opposite end (the right end in FIG. 1) of core insert 15 to direct the flow of reagent radially outwardly through openings 21 in the surface of core insert 15.

Figure 2:
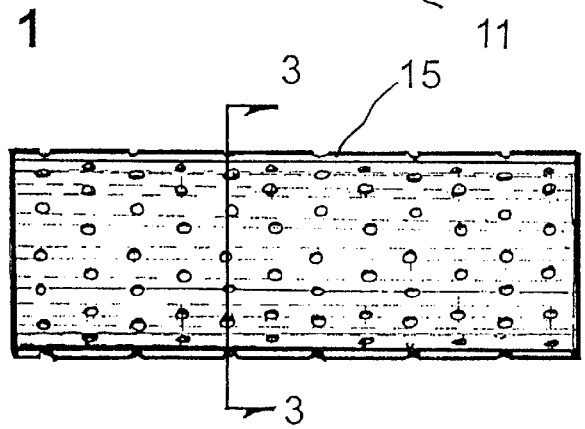
FIG. 2 is an enlarged detail view of a core insert of the apparatus of FIG. 1
Figure 3:
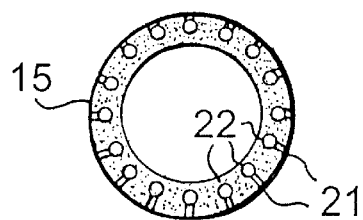
FIG. 3 is a sectional view of the core insert of FIG. 2 as seen from the line 3—3 of FIG. 2.

Referring additionally to FIGS. 2 and 3, an enlarged detail view of core insert 15 is illustrated. As can be seen from FIG. 3, core insert 15 is formed as a tubular shell which includes a plurality of longitudinally extending channels 22 formed therein. Each channel 22 is in communication with reagent supplying member 16 for receiving fluid therethrough at the left end and is sealed at the right end by end plug 20. Also, each channel 22 has a plurality of radially extending openings 21 in communication therewith so that fluid flowing in each of the channels 22 exits through the radially extending openings 21. Fluid openings 21 are spaced apart and arranged in staggered longitudinally extending rows along the surface of core insert 15.

Figure 5:
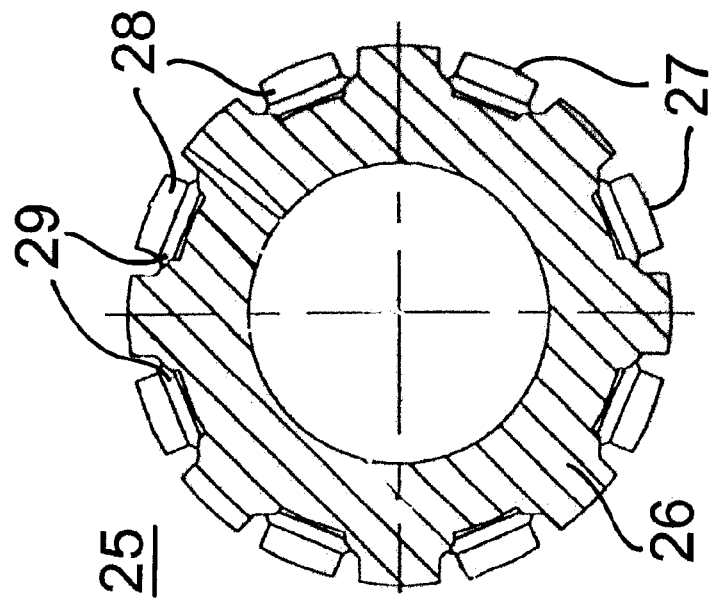
FIG. 5 is a sectional view of the cleaning sponge of FIG. 4 as seen from the line 5—5 of FIG. 4.
Figure 4:
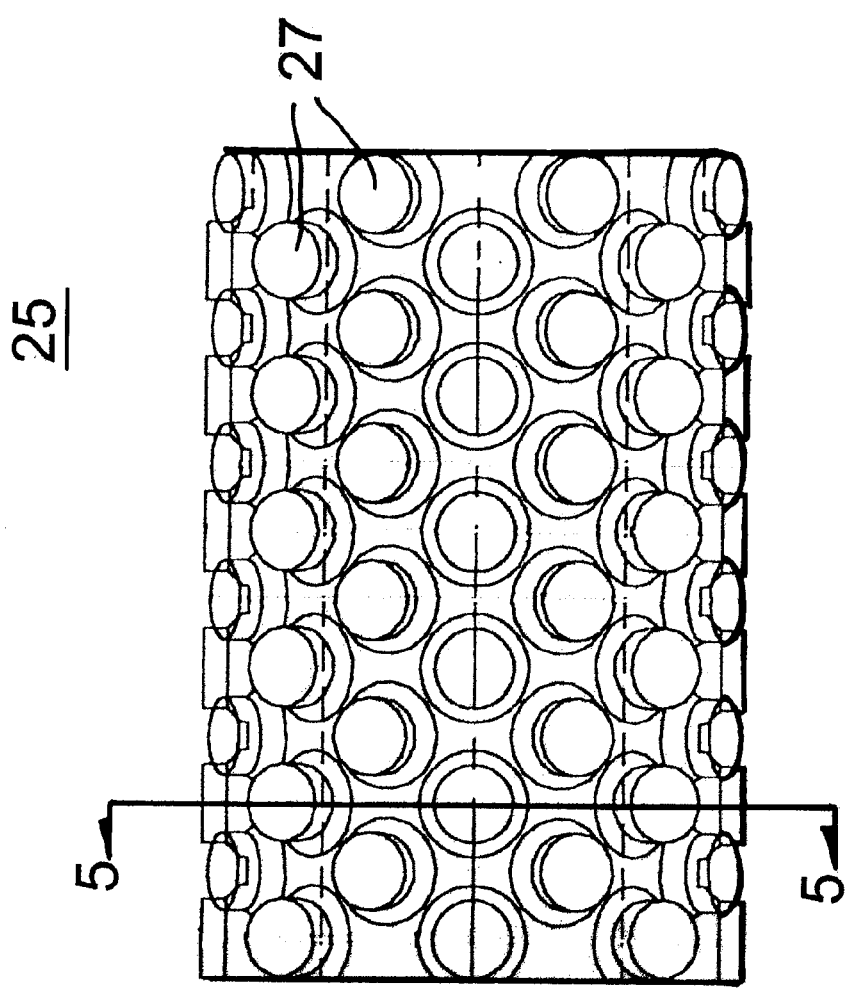
FIG. 4 is an enlarged detail view in side elevation of a cleaning sponge used with the apparatus of FIG. 1, in accordance with the present invention.
Figure 6:
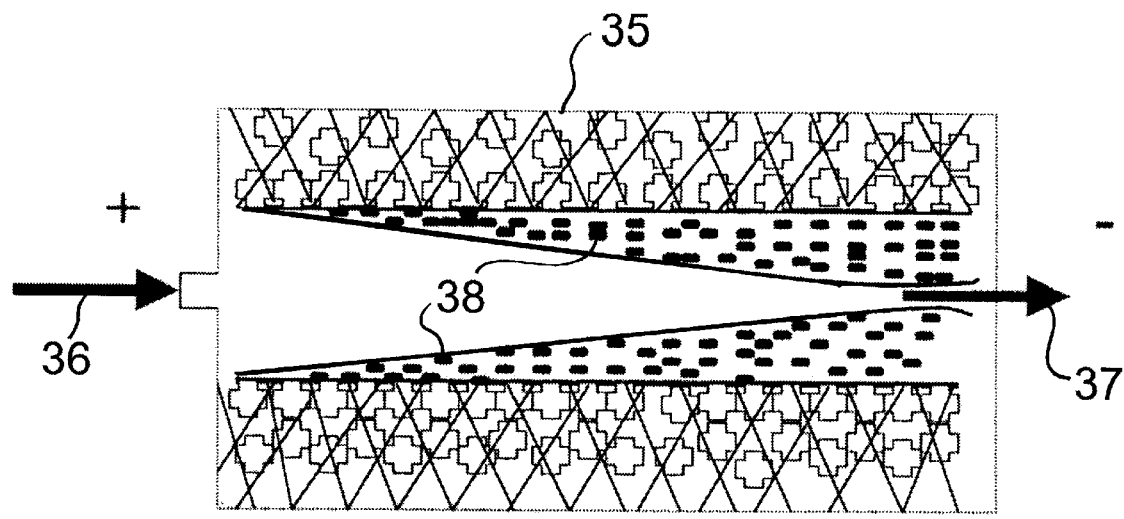
FIG. 6 is schematic diagram of the formation of a streaming potential in a cleaning sponge.

A sponge roller 25 is frictionally engaged, coaxially over core insert 15 for rotation with shaft 12 and core insert 15. Roller 25 is illustrated in detail in FIGS. 4 and 5. In this specific embodiment and for purposes of this explanation, roller 25 is formed in a nub pattern to facilitate cleaning and liquid flow as will be described. However, it should be understood that other patterns and embodiments designed to produce the described effects could be devised by those skilled in the art and are intended to be encompassed by this disclosure. Roller 25 includes a body 26 which is formed of a porous material or otherwise formed to conduct reagent fluid from openings 21 in core insert 15 to the outer surface. A plurality of nubs 27 are formed in staggered longitudinally extending rows on the outer surface of body 26. In this embodiment, each nub 27 includes a radially extending cylindrical portion 28 of cleaning sponge material with a supporting fillet 29 surrounding portion 28 adjacent the surface of body 26.

Nubs 27 are positioned in staggered longitudinally extending rows so that each nub is radially aligned with a fluid opening 21 in core insert 15. Thus, fluid entering apparatus 10 through duct 17 flows longitudinally through channels 22. The fluid exits channels 22 through radially directed openings 21 and flows radially outwardly through nubs 27. Nubs 27 are staggered to ensure contact with every portion of the surface of wafer 11 and, since each nub 27 has a fluid opening 21 associated therewith, the reagent or cleaning fluid exits apparatus 10 through the outer surface of each nub 27 in a radial flow pattern. This radial flow, or flow perpendicular to the surface of each nub 27, produces a "streaming potential" in the sponge material of each nub 27. As will be explained in more detail below, the streaming potential produced in each nub 27 provides a substantially improved cleaning operation.

Turning now to the operation of apparatus 10, polyvinyl alcohol (PVA) sponges or brushes are considered to be a new generation for cleaning surfaces of wafers. PVA sponge is a soft, elastic, and porous material. For more information on this material, see U.S. Pat. No. 5,844,030, issued in 1998 and incorporated herein by reference. PVA sponge material has been effectively applied to remove both particulate and metallic contaminants in post-CMP cleaning processes. These contaminants include both the adhered as well as the mechanically embedded particles on the wafer surface and can be used to remove particles as small as 0.12 $\mu$m without damaging the wafer surface. While a PVA sponge or brush is used and described throughout most of this disclosure as a preferred embodiment, it should be understood that apparatus 10 could be used with virtually any kind of cleaning sponge or brush designed for surface cleaning operations.

The wafer surface, brush, and contaminated particles are charged in an aqueous environment. Therefore, the brush scrubbing process is a mechanical and electrical interaction of the wafer surface, the brush, and the particles. Four possible events can be encountered in any wafer cleaning process. In a first possibility, the wafer surface, the brush and the particles all carry the same electrical sign charge (e.g., either positive or negative). In this event, particles are repelled by the brush and the wafer surface and are easily removed from the surface. In a second possibility, particles carry the same electrical charge as the wafer surface, but not the same as the brush. In this event, particles will attach onto the brush pores and finally will recontaminate the wafer surface. In a third possibility, particles carry the same electrical sign as the brush, but not the same as the wafer surface. In this event, the wafer surface is hard to clean because the particles are electrically attracted to it. In a fourth possibility, the embedded particles cannot be removed with a normal brush. This problem can be solved by changing the brush properties, such as hardness, pore size, etc. This specific event will not be discussed further herein.

Identifying the wafer surface, contaminant particles, and the brush's surface charge in an aqueous environment will be very helpful for post-CMP cleaning, because their surface charges can be controlled with pH, electrolyte valence type, surfactants, and other chemicals. The major purpose of this disclosure is to explain the electrokinetic properties of the PVA sponge materials which produces the streaming process, and illustrate a clean-up strategy by using these electrokinetic properties or streaming potentials.

A surface charge is commonly characterized with zeta-potential ($\zeta$), which is defined as the potential difference, measured in a liquid (cleaning fluid, reagent, etc,), between the shear plane and the bulk of the liquid. The zeta-potential cannot be measured directly, but can be calculated from measurements of the electrophoretic mobility of particles using the Smoluchowski equation:

$$U/E = \in \zeta / K\eta \tag{1}$$

For more information on this equation see J. Hunter, "*Zeta Potential in Colloid Science—Principles and Application*", Academic Press, London, 1986. The zeta-potential can also be calculated from measurements of the streaming potential of a PVA porous plug using the equation:

$$dE_s/dP = \in \zeta / \eta \lambda_p \tag{2}$$

Where:
   U is the velocity of the particle;
   E is the potential gradient;
   $\in$ is the dielectric constant of the liquid;
   $\eta$ is the viscosity of the liquid;

K is the constant that has a value of 1 or 1.5, depending on whether particle size >> double layer thickness or << double layer thickness;

$E_s$ is the streaming potential; and

P is the applied hydrologic pressure.

$$\lambda_p = \lambda_o + 2\lambda_s/r$$

where:

$\lambda_o$ is the conductivity of the liquid;

$\lambda_s$ is the surface conductivity of the porous sample; and r is the diameter of the pore.

In equation (2), $dE_s/dP$ is independent of flow rate and proportional to zeta-potential. The isoelectric point, defined as the solution pH at which the zeta-potential $\zeta$–0, can be determined with interpolation of $dE_s/dP$ and pH values.

The principle of streaming potential forming on the PVA sponge (specifically a cationic PVA sponge as disclosed in U.S. Pat. No. 6,033,486, herein incorporated by reference) at a low pH value is shown in FIG. 1. Referring specifically to FIG. 1, a cationic sponge 35 is illustrated in cross-section having a flow of liquid into the left end, indicated by arrow 36, and a flow of liquid exiting the right end, indicated by arrow 37 A plurality of adhered ions 38 are illustrated (as small rectangles) distributed along the inner surface of sponge 35. The flowing liquid drives adhered ions 38 in a double layer along the flowing direction (arrow 36 to arrow 37). The ion concentration adjacent the right end of sponge 35 is higher than the concentration adjacent the left end, which generates a potential difference across sponge 35. The potential difference of the two ends has the same electrical sign as the surface charge of sponge 35, i.e., the end adjacent arrow 36 with the lower accumulation of ions is designated positive and the end adjacent arrow 37 with the higher accumulation of ions is designated negative.

Figure 7:
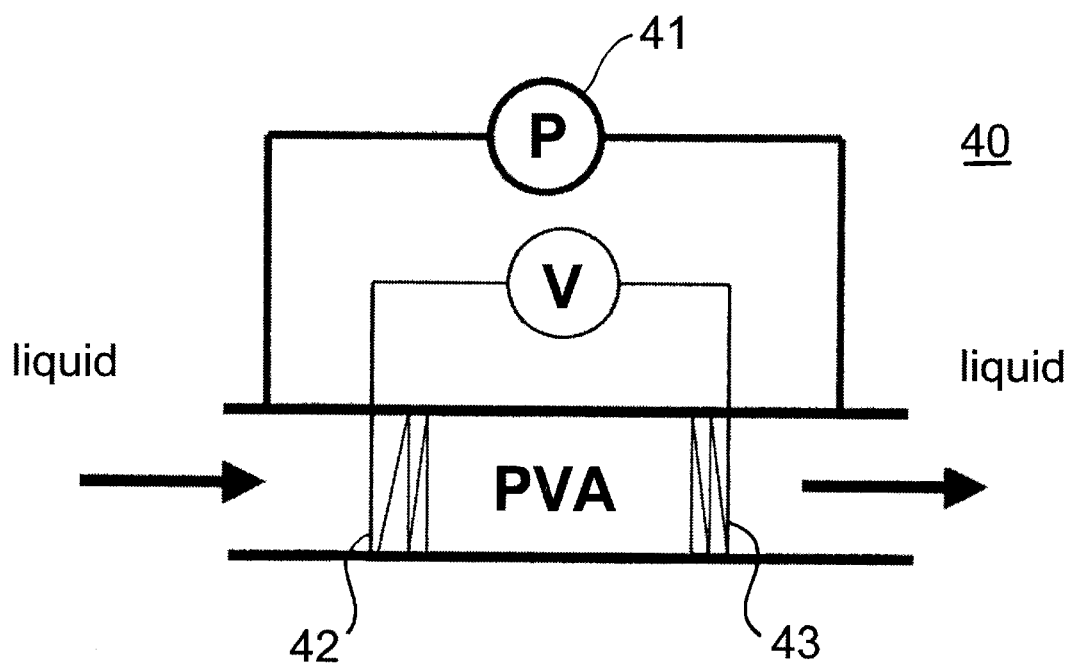
FIG. 7 is a schematic diagram of equipment used to provide streaming potential measurements.

PVA sponge material's streaming potentials are measured with an experimental setup 40 illustrated schematically in FIG. 7. A high pressure nitrogen gas is used as the driving force for the liquid flowing through PVA sponge 35. The pressure difference of the two sides of PVA sponge 35 is measured by using a calibrated pressure gauge 41. Streaming potentials across. PVA sponge 35 at ambient temperature and pressure from 0 to 8 psi are measured with two platinum electrodes 42 and 43.

Figure 8:
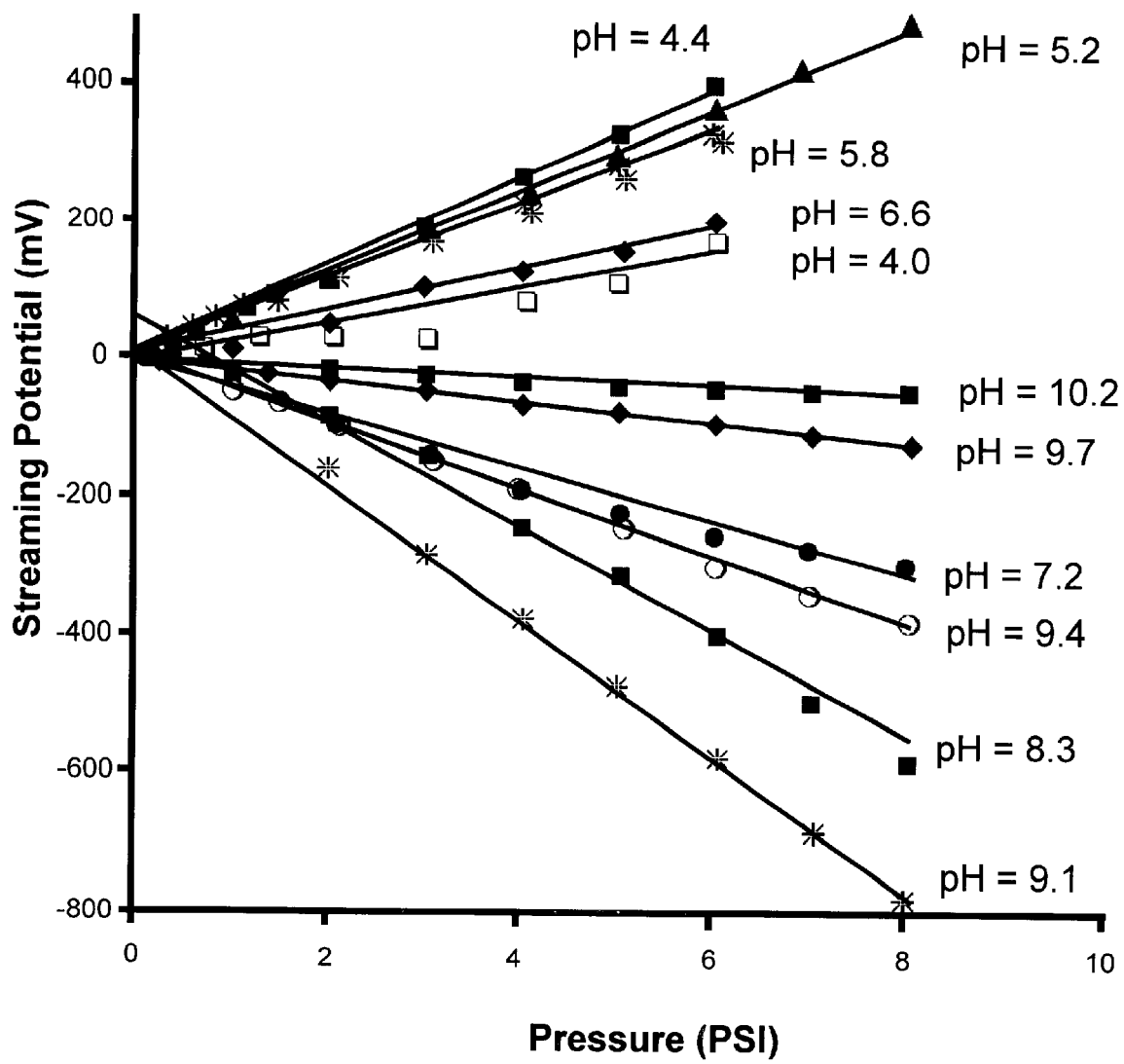
FIG. 8 is a graphical representation of measured streaming potentials for a cationic PVA sponge.

The streaming potentials versus pressure for a cationic sponge at various pHs are illustrated graphically in FIG. 8. The accuracy of the streaming potentials is about ±0.5 mV, the uncertainty of pressure data is 1%, and the pH values are varied from 3.0 to 12.0 with ±0.1 accuracy. The streaming potential is normally reproducible within±2% for the same PVA sponge sample. The maximum Reynolds number for liquid flowing through the PVA sponge sample is about 10, which indicates that the liquid is apparently in laminar flow. As expected with equation (2), the plots of the streaming potentials versus pressure in FIG. 8 are straight lines. The standard deviation ($\sigma^2$) of linear correlation for these experimental data is lower than 0.02 ($R^2 > 0.98$). At p=0, no streaming potentials were generated, but the potential difference between platinum rods 42 and 43 (see FIG. 7) is usually not equal to zero due to the surface conditions of electrodes 42 and 43 not being exactly the same. In the graph of FIG. 8, the streaming potential values at a given pH were deducted by its value at p=0, so that all lines start from the original point. These corrections do not change the slope of the lines. It should be noted that the cationic PVA sponge generates high streaming potentials, for example, at P=8 psi, the streaming potential reaches as high as 800 mV.

Figure 9:
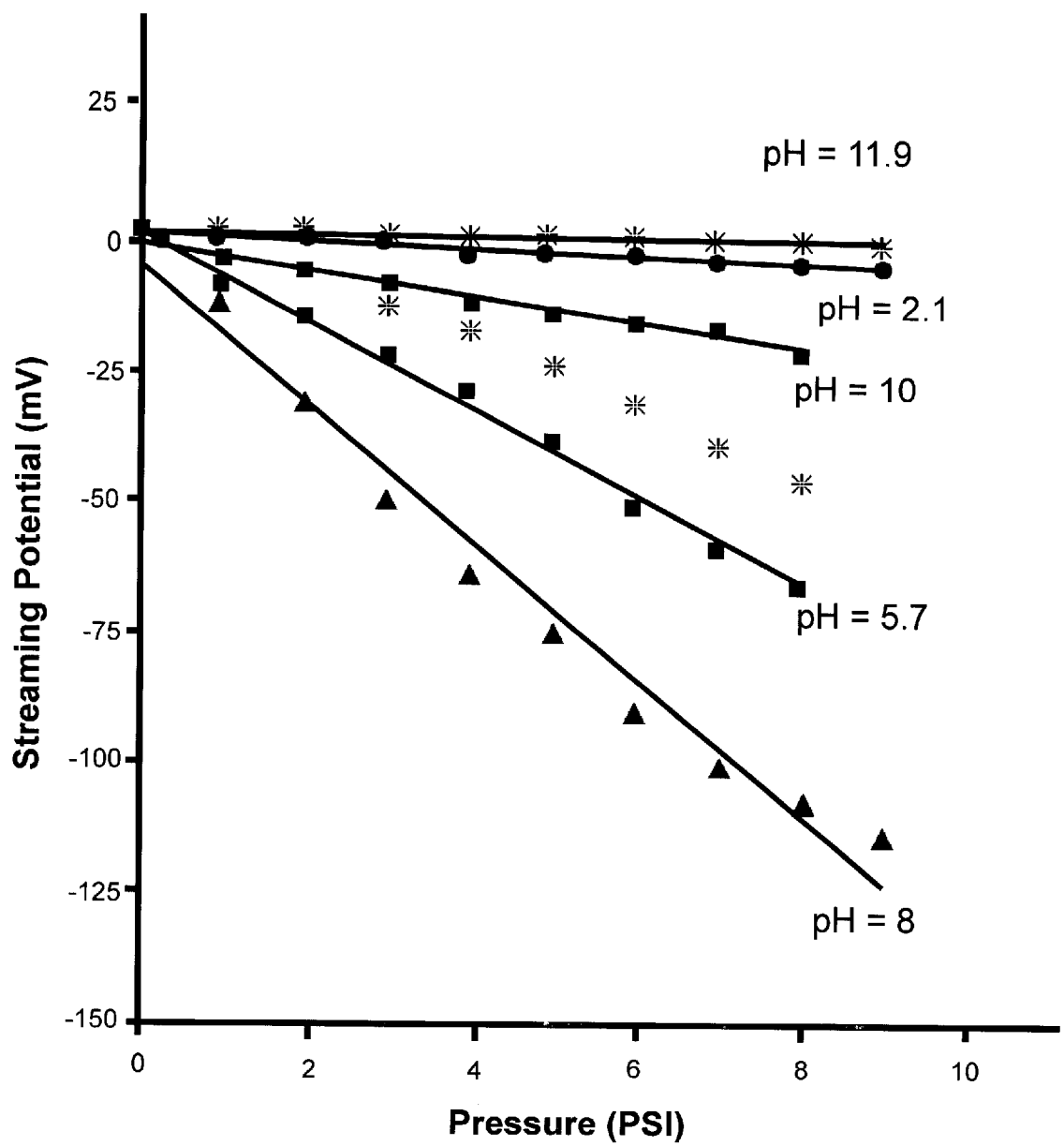
FIG. 9 is a graphical representation of measured streaming potentials for an anionic PVA sponge.
Figure 10:
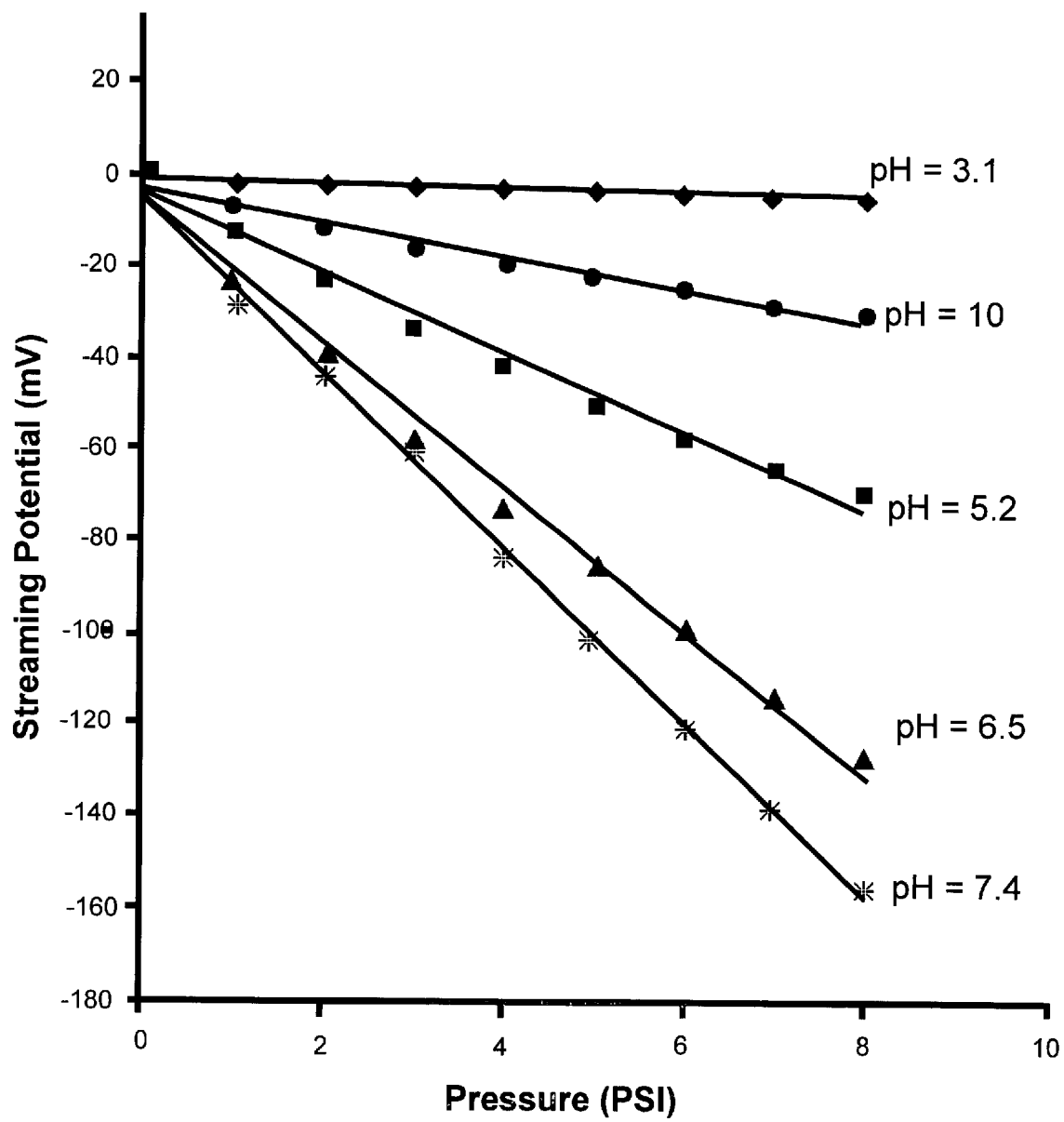
FIG. 10 is a graphical representation of measured streaming potentials for a neutral PVA sponge.

The variations of the streaming potential with pressure for anionic and neutral PVA sponges at various pH values were also measured and are illustrated graphically in FIGS. 9 and 10, respectively. The streaming potentials of these two materials are also proportional to the applied hydrological pressure. The accuracy and reproducibility of this data is similar to those of the cationic PVA sponge described above. The absolute values of the streaming potentials are smaller than those of the cationic PVA sponges. It cannot simply be concluded that the cationic PVA sponge has a higher zeta-potential than other PVA sponges. Pore size, pore structure, and pore surface conductivity affect the streaming potentials. Higher streaming potentials (absolute values) can be generated in cylindrical pore structures than in other pore structures. In other pore structures, the generated streaming potentials in the pore structures do not have the same polar direction, and they will offset each other. But in cylindrical pore structures, the generated streaming potentials have the same polar direction; the overall streaming potential is the summation of those in different parts of a cylindrical pore.

The slopes of the lines in FIGS. 8–10 represent $dE_s/dP$ which are independent of the applied hydrological pressure (or flow rate) and proportional to the zeta-potential for the samples with cylindrical pore structure. Here, $dE_s/dP$ is defined as the relative streaming potential (RSP). RSP has the same electrical sign as the zeta-potential.

Figure 11:
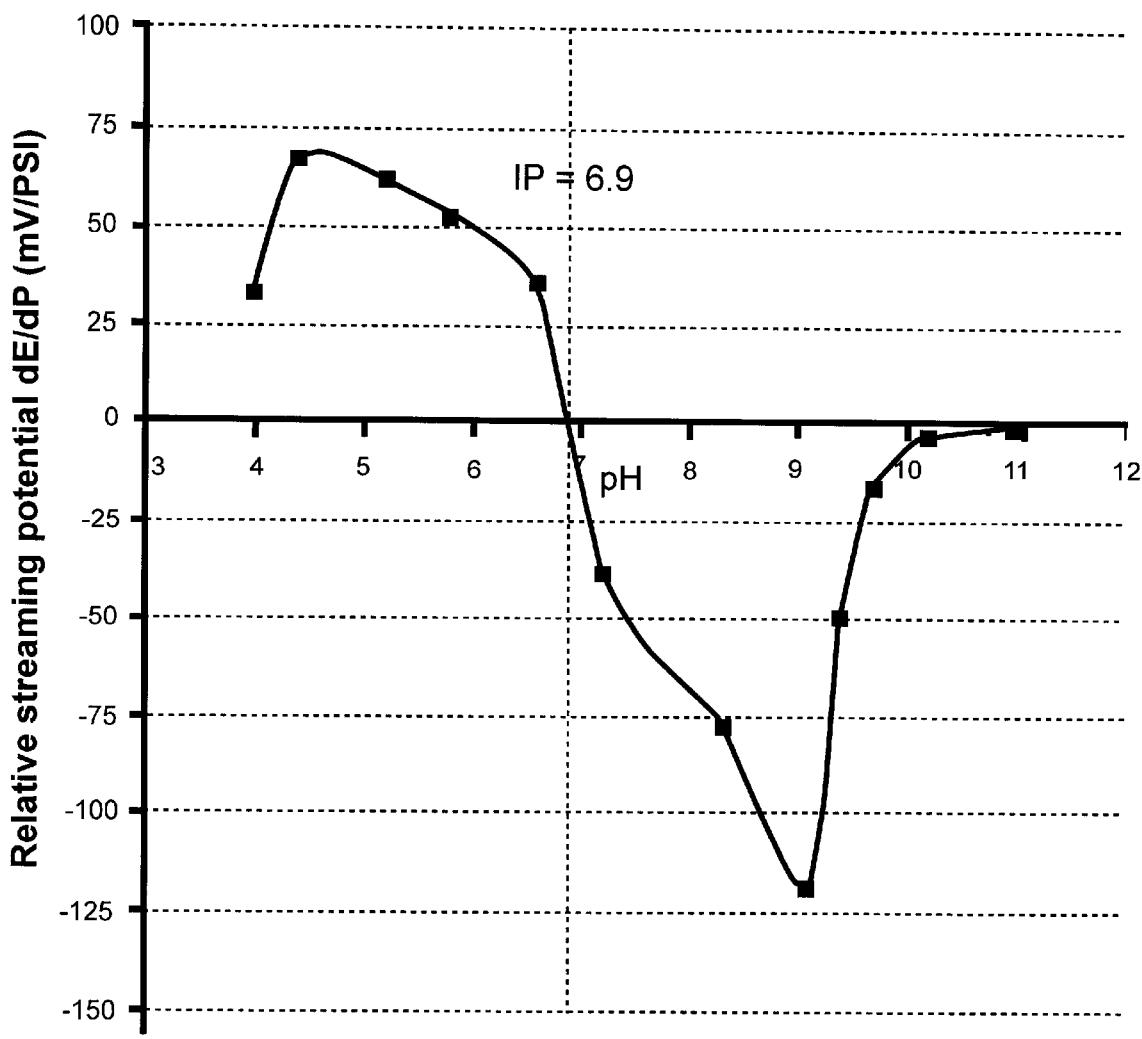
FIG. 11 is a graphical representation of relative streaming potentials for the cationic PVA sponge.
Figure 12:
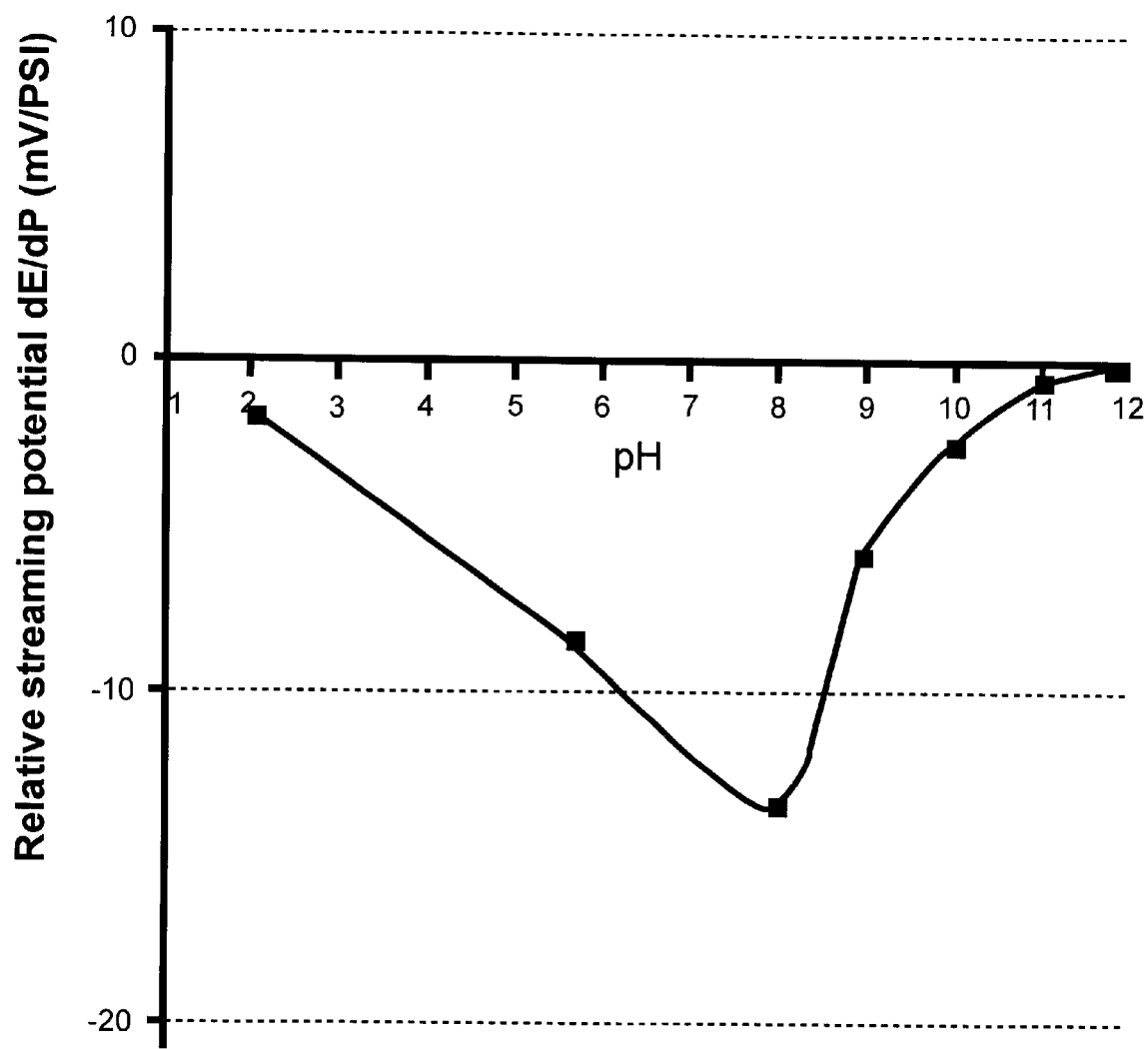
FIG. 12 is a graphical representation of relative streaming potentials for the anionic PVA sponge.
Figure 13:
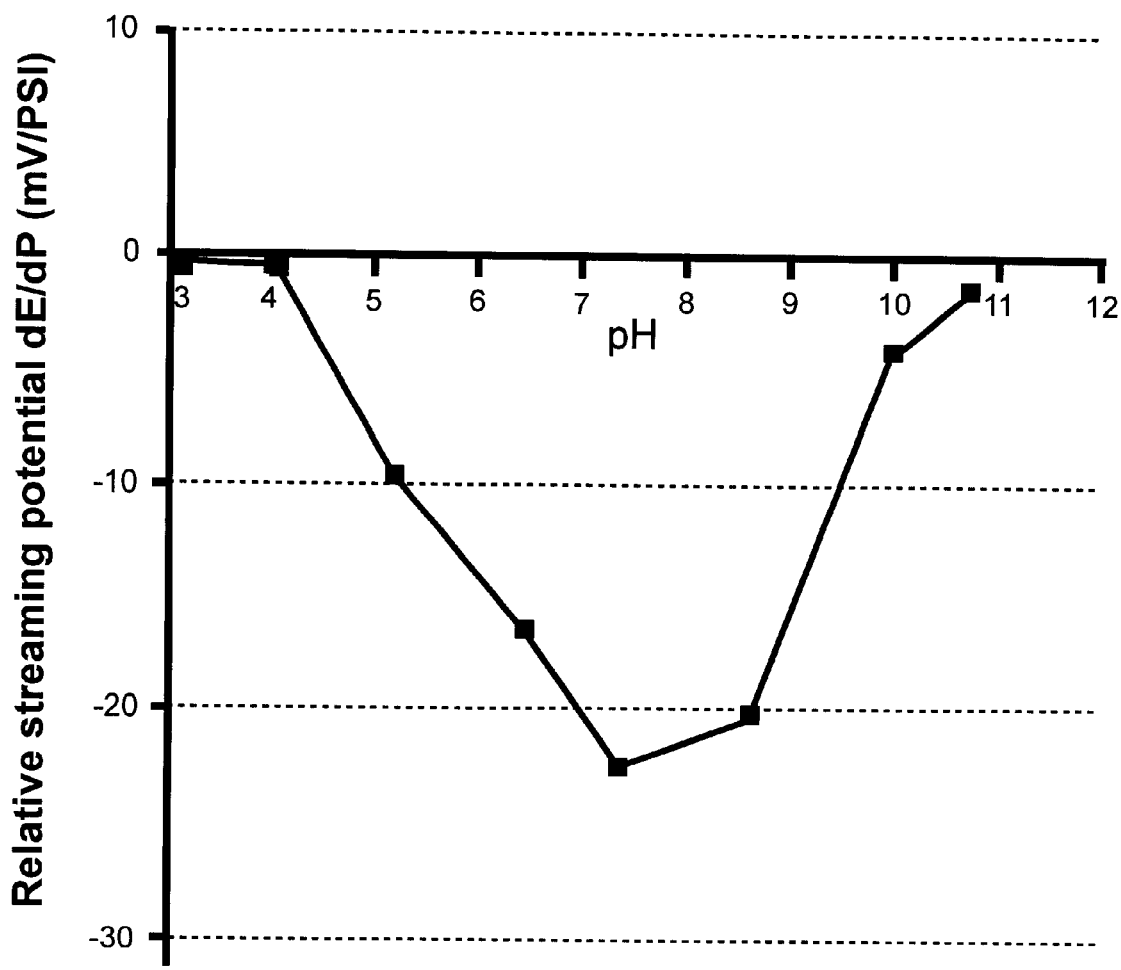
FIG. 13 is a graphical representation of relative streaming potentials for the neutral PVA sponge.
Figure 14:
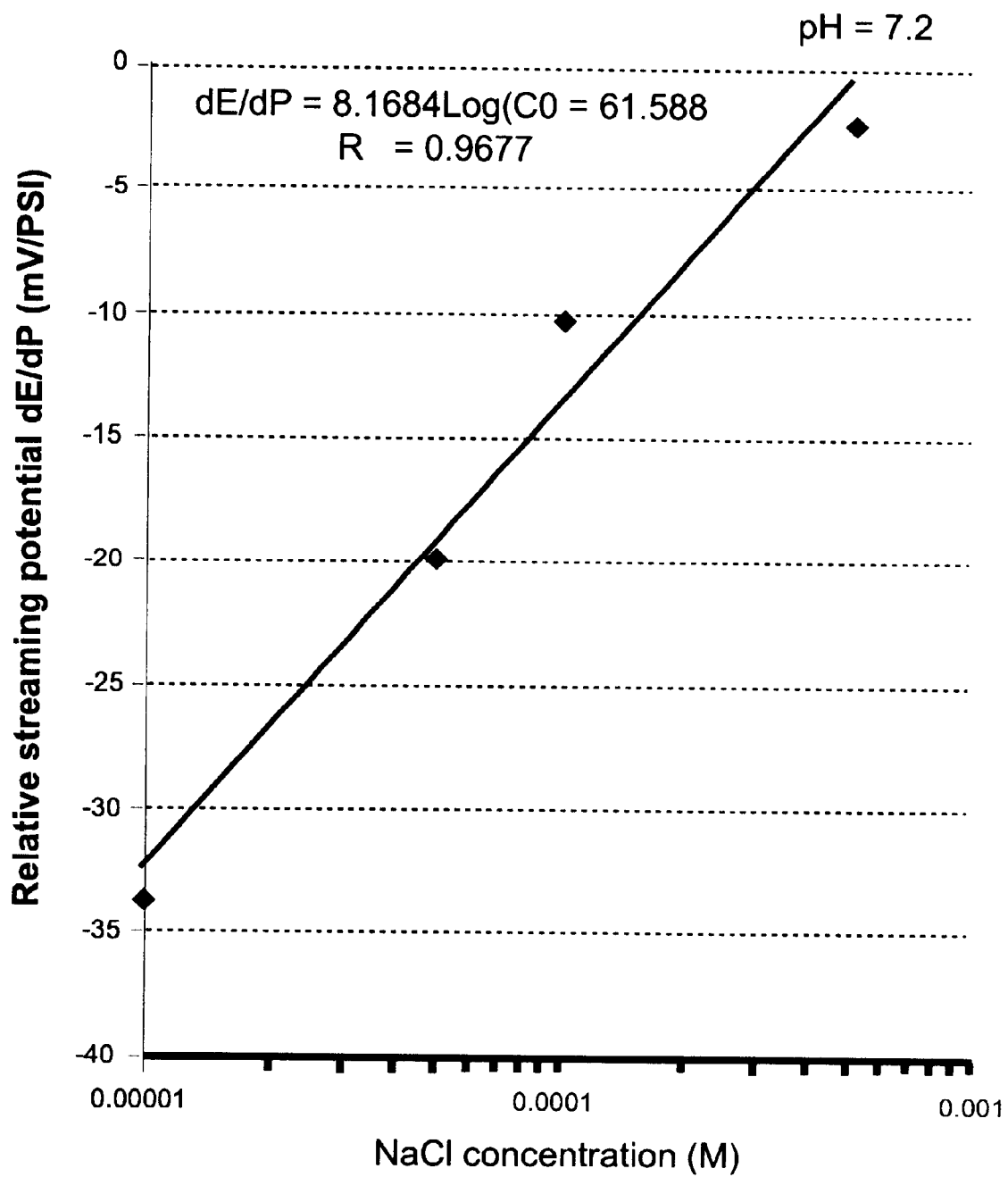
FIG. 14 is a graphical representation of relative streaming potentials for the cationic PVA sponge at various ionic strengths.

Variations of RSP with pH for cationic, anionic, and neutral PVA sponges are illustrated graphically in FIGS. 11, 12, and 13, respectively. The isoelectric point (IEP) for the cationic PVA sponge is 6.9, for the anionic PVA sponge is less than 3, and for the neutral PVA sponge is about 3. For the cationic PVA sponge, more and more hydroxyl groups are adsorbed on the surface and neutralize the surface positive charge as the pH increases. At the IEP, the surface positive charge is completely neutralized. At a pH higher than the IEP, the adsorbed hydroxyl groups dominate the surface charge, therefore, the RSP becomes negative At pH<4 or pH>10, the RSP declined. The difference of the positive ion concentration between the shear plane and bulk solution decreases as the electrolyte concentration increases. At high electrolyte concentration (or high ionic strength), this difference goes to zero. Therefore, the RSP or zeta-potential decreases as electrolyte concentration increases. In order to further confirm this phenomena, the streaming potentials for the cationic PVA sponge at a pH of 7.2 were measured at different electrolyte concentrations ($1\times10^{-5}$M, $5\times10^{-5}$M, $5\times10^{-4}$M, and $1\times10^{-4}$M NaCl). The RSP determined with experimental data linearly declined with logC as shown in FIG. 14.

The zeta-potential can be affected by the electrolyte concentration, electrolyte valence type, surfactants, polymers, and so on, besides pH values. In post-CMP cleaning, the surface charge of the brush, the contaminant particles, and the wafer can be controlled to the same charge sign so as to make them mutually repulsive during the cleaning process. This corresponds to the first cleaning event described above, in which event, particles are repelled by the brush and the wafer surface and are easily removed from the surface. For example, a wafer contaminated with $Si_3N_4$, $SiO_2$, and $Al_2O_3$ can be cleaned by controlling the pH>8.0. At a pH higher than 8.0, the brush, particles, and wafer have negative charges. For the wafer contaminated with copper, the cleaning process can be controlled at pH>4.0 and by addition of citric acid.

In conclusion, the measured streaming potentials for cationic, anionic, and neutral PVA sponges are linearly proportional to the applied hydrological pressure at ambient temperature and within a pressure range from 0 to 8 psi. The streaming potential for the cationic PVA sponge can reach as high as 800 mV at 8 psi. The relative streaming potentials vary with pH values. The determined isoelectric point for the cationic PVA sponge is 6.9, for the anionic PVA sponge is less than 2, and for the neutral PVA sponge is about 3. The electrolyte concentrations strongly affect the streaming potential for PVA sponges. Using these electrokinetic and other special properties, the PVA sponge or brush assembly described above can be successfully applied in post-CMP cleaning of wafers. Wafers can be easily and efficiently cleaned with the above described PVA sponge or brush by controlling pH, electrolytic concentration, electrolyte valence type, or by the addition of surfactants.

Thus, in surface charge controlling apparatus 10 for cleaning wafers, the flow of cleaning reagents is always directed perpendicularly upon the surface of the object being cleaned. As the reagent leaves the surface of nubs 27, a streaming potential is produced between the inner radius of the inner diameter of cleaning sponge 25 and the outer surface. This redirectional process of the cleaning reagents has an effect upon the surface charge of the wafer.(wafer 11) being cleaned. At selected pH values and pressure of the cleaning reagents, an electrical effect is created whereby all the particles on the surface of the wafer exhibit a neutral charge. This point is referred to as the isoelectric point (IEO). It is here that the first cleaning event, described above, is encountered in cleaning and whereby the manipulation of the IEP controls the events of cleaning upon the surface of the wafer.

Therefore, new and improved wafer cleaning apparatus is disclosed which is capable of quantitatively controlling surface charges as it cleans. Also, a new and improved method of cleaning wafer surfaces is disclosed. New and improved apparatus and methods for cleaning wafer surfaces are disclosed and described wherein an electrical potential is generated through the surface of a cleaning brush to control the removal of charged particles on the surface. This electrical potential, or streaming potential, is generated by redirecting the flow of cleaning fluid or reactants perpendicularly through a cleaning sponge or brush. Through use of the streaming potential and other variables (e.g. pH values, pressure, etc.) the charge on a wafer surface, contaminant particles, and the cleaning brush can be made neutral or all the same charge to greatly improve the cleaning of contaminant particles from the surface of a wafer.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. Wafer cleaning apparatus comprising;
    a plurality of sponge portions mounted on a common body for movement relative to a surface of a wafer to be cleaned, each sponge portion defining a sponge surface positioned to contact the surface of the wafer;
    a plurality of ducts constructed to receive cleaning fluid flowing therethrough, the plurality of ducts being affixed to the common body and directing cleaning fluid through each sponge portion perpendicular to the sponge surface and onto the surface of the wafer; and
    a source of cleaning fluid having means for adjusting a pressure and pH of said fluid so that electrical charges on the sponge portions, are the same electrical sign as known electrical charges of the wafer to be cleaned and contaminant particles on the surface of the wafer to be cleaned.

2. Wafer cleaning apparatus as claimed in claim 1 wherein the source of cleaning fluid includes electrolyte concentrations and an electrolyte valence type selected so that electrical charges on the sponge portions, the wafer and contaminant particles on the surface of the wafer are all the same electrical sign.

3. Wafer cleaning apparatus as claimed in claim 1 wherein the source of cleaning fluid includes surfactants selected so that electrical charges on the sponge portions, the wafer and contaminant particles on the surface of the wafer are all the same electrical sign.

4. Wafer cleaning appararatus as claimed in claim 1 wherein the plurity of sponge portions mounted on the common body include a cylindrically shaped sponge with a plurality of nubs formed in an outer surface.

5. Wafer cleaning apparatus as claimed in claim 4 wherein the plurality of ducts include a tubular member with a plurality of radially directed openings, one for each nub of the plurality of nubs.

6. Wafer cleaning apparatus comprising;
    a cylindrically shaped common tubular body with a plurality of sponge nubs formed in the outer surface, the tubular body being mounted for rotary movement relative to a surface of a wafer to be cleaned, each sponge nub defining a sponge surface positioned to contact the surface of the wafer; and
    a tubular liquid redirecting member positioned coaxially within the tubular body, the tubular member including a plurality of longitudinally extending fluid channels with radially directed openings, one each of the radially directed openings associated with each nub, each channel constructed to receive a flow of cleaning fluid therein, the cleaning fluid exiting through the openings so as to direct cleaning fluid through each sponge nub perpendicular to the sponge surface and onto the surface of the wafer.

7. Wafer cleaning apparatus as claimed in claim 6 including in addition a source of cleaning fluid attached to the tubular liquid redirecting member and having means for adjusting a pressure and pH of said fluid so that electrical charges on the sponge surfaces, are the same electrical sign as,known electrical charges of the wafer and contaminant particles on the surface of the wafer.

8. Wafer cleaning apparatus as claimed in claim 7 wherein the source of cleaning fluid includes electrolyte concentrations and an electrolyte valence type selected so that electrical charges on the sponge surfaces, the wafer and contaminant particles on the surface of the wafer are all the same electrical sign.

9. Wafer cleaning apparatus as claimed in claim 7 wherein the source of cleaning fluid includes surfactants selected so that electrical charges on the sponge surfaces, the wafer and contaminant particles on the surface of the wafer are all the same electrical sign.

10. Wafer cleaning apparatus comprising;
    a plurality of sponge portions mounted on a common body for movement relative to a surface of a wafer to be cleaned, each sponge portion defining a sponge surface positioned to contact the surface of the wafer;
    means for directing a cleaning fluid flow through each of the sponge portions perpendicular to the sponge surface and onto the surface of the wafer to generate a streaming potential across each of the sponge portions, and a source of cleaning fluid attached to the means for directing a cleaning fluid flow and having means for adjusting a pressure and pH of said fluid so that electrical charges on the sponge surfaces, are the same electrical sign as known electrical charges of the wafer to be cleaned and contaminant particles on the surface of the wafer to be cleaned.

11. Wafer cleaning apparatus as claimed in claim 10 wherein the source of cleaning fluid includes electrolyte concentrations and an electrolyte valence type selected so that electrical charges on the sponge surfaces, the wafer and contaminant particles on the surface of the wafer are all the same electrical sign.

12. Wafer cleaning apparatus as claimed in claim 10 wherein the source of cleaning fluid includes surfactants selected so that electrical charges on the sponge portions, the wafer and contaminant particles on the surface of the wafer are all the same electrical sign.

* * * * *

UNITED STATES PATENT AND TRADEMARK OFFICE
CERTIFICATE OF CORRECTION

PATENT NO. : 6,523,210 B1 Page 1 of 1
DATED : February 25, 2003
INVENTOR(S) : Andros, Nicholas It is certified that error appears in the above-identified patent and that said Letters Patent is hereby corrected as shown below:

Column 4,
Line 62, replace "$dE_s/d/P = \varepsilon\zeta/\eta\lambda_p$" with -- $dE_s/dP = \varepsilon\zeta/\eta\lambda_p$ --

Signed and Sealed this

Sixth Day of April, 2004

JON W. DUDAS
*Acting Director of the United States Patent and Trademark Office*